US007799514B1

(12) United States Patent
Subramanian et al.

(10) Patent No.: US 7,799,514 B1
(45) Date of Patent: Sep. 21, 2010

(54) SURFACE TREATMENT WITH AN ACIDIC COMPOSITION TO PREVENT SUBSTRATE AND ENVIRONMENTAL CONTAMINATION (75) Inventors: Ramkumar Subramanian, Sunnyvale, CA (US); Bhanwar Singh, Morgan Hill, CA (US); Gilles Amblard, San Jose, CA (US)

(73) Assignee: Globalfoundries Inc, Grand Cayman (KY)

( * ) Notice: Subject to any disclaimer, the term of this patent is extended or adjusted under 35 U.S.C. 154(b) by 1135 days.

(21) Appl. No.: 10/957,367

(22) Filed: Oct. 1, 2004

(51) Int. Cl.
*G03F 7/26* (2006.01)
(52) U.S. Cl. ...................... 430/322; 430/330
(58) Field of Classification Search ............... 430/327, 430/322
See application file for complete search history.

(56) References Cited

U.S. PATENT DOCUMENTS

| 4,007,047 | A | * | 2/1977 | Kaplan et al. ............... 430/324 |
| 6,251,570 | B1 | * | 6/2001 | Phan et al. .................. 430/327 |
| 6,352,817 | B1 | | 3/2002 | Rangarajan et al. |
| 6,383,723 | B1 | * | 5/2002 | Iyer et al. .................... 430/327 |
| 6,586,820 | B2 | | 7/2003 | Yin et al. |
| 6,699,644 | B1 | | 3/2004 | Lee et al. |
| 2002/0055064 | A1 | * | 5/2002 | Iguchi et al. ............. 430/270.1 |
| 2002/0076626 | A1 | * | 6/2002 | Montgomery et al. .......... 430/5 |
| 2003/0180667 | A1 | * | 9/2003 | Takano et al. ............... 430/311 |
| 2005/0032371 | A1 | * | 2/2005 | An et al. ..................... 438/689 |

FOREIGN PATENT DOCUMENTS

JP         2004-029088       *  6/2002

* cited by examiner

*Primary Examiner*—Kathleen Duda
*Assistant Examiner*—Brittany Raymond
(74) *Attorney, Agent, or Firm*—Turocy & Watson, LLP (57) ABSTRACT

Disclosed are methods for eliminating and/or mitigating the formation of footing and/or T-tops in a resist pattern. A substrate with or without an antireflective coating layer may be treated with an acidic composition prior to the formation of a resist layer. The acid treatment prevents the loss of photo generated acid from the resist by either quenching and/or neutralizing the bases, and thereby reduces the formation of footing. The surface of a resist layer which has been irradiated may be treated with an acidic composition prior to post-exposure bake. The acid treatment prevents the loss of photo generated acid from the resist by either compensating for the evaporation and/or neutralization of the bases and thereby prevents the formation of T-tops.

5 Claims, 7 Drawing Sheets

SURFACE TREATMENT WITH AN ACIDIC COMPOSITION TO PREVENT SUBSTRATE AND ENVIRONMENTAL CONTAMINATION

TECHNICAL FIELD

The present invention generally relates to lithography processes. More particularly, the present invention relates to methods for mitigating formation of footing and/or T-tops in a resist.

BACKGROUND

In the semiconductor industry, there is a continuing trend toward higher device densities. Fabrication of very large scale integrated circuits (VLSI) and ultra large scale integrated circuits (ULSI) requires that resist materials, lithographic processes, and exposure tools meet necessary performance demands for high throughput manufacturing of sub-micron feature size devices. In particular, the semiconductor industry is producing, with increasing frequency, integrated circuits having structures which are markedly less than 1 µm. The increased integration density increases the requirements imposed on the photolithographic process.

Resist compositions are used in microlithographic processes for making miniaturized electronic components, such as in the fabrication of semiconductor device structures. For exposure apparatuses using short-wavelength light, such as an excimer laser, chemical amplification type resists are often employed. The chemical amplification type resists generally consist of a resin, a photosensitive acid generator, and a solubilizer or a cross-linking agent. The acid generator generates an acid upon exposure. During post-exposure baking (PEB), this acid functions as a catalyst to encourage the reaction of the solubilizer or the cross-linking agent, and a pattern is formed by development. A photoresist using the solubilizer forms positive patterns, and a photoresist using the cross-linking agent forms negative patterns.

One concern regarding utilization of chemically amplified resists is that their profile is degraded by airborne and substrate contaminants such as amines, ammonia, n-methylpyrrolidone, and tetramethylammonium hydroxide. Airborne contaminants produce T-top effects and alkaline substrate contaminants cause footing effects.

Figure 1:
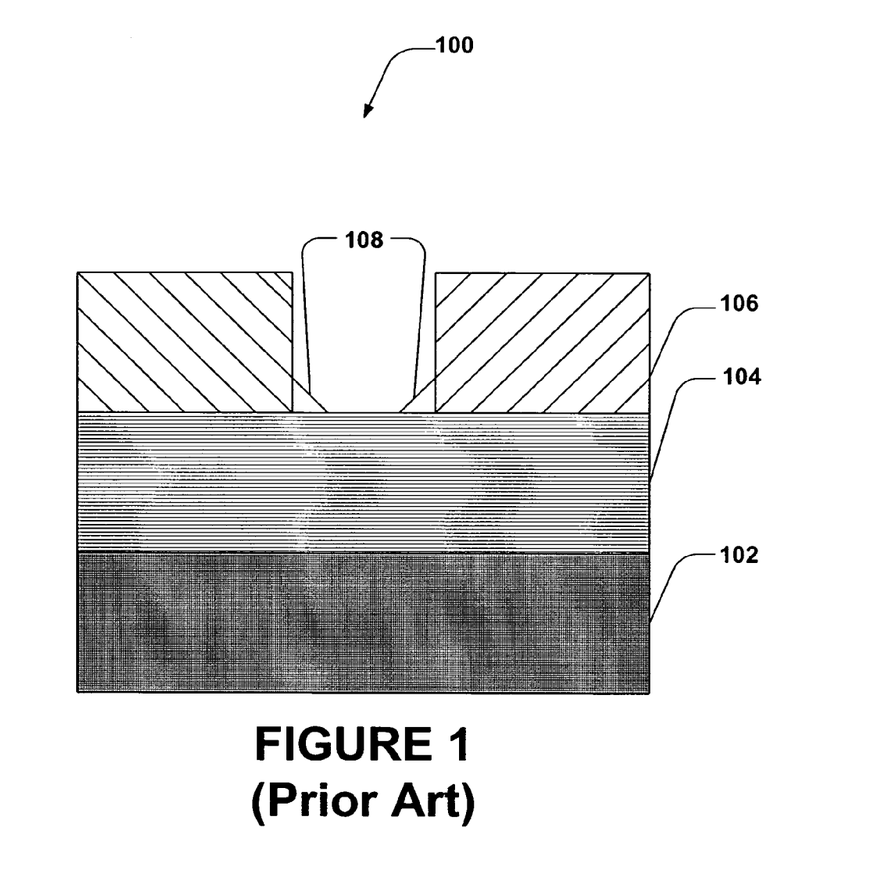
FIG. 1 depicts a cross-sectional illustration of a patterned semiconductor device exhibiting footing defect.

Footing occurs when a resist that remains after development does not have substantially vertical walls. Instead, a foot is formed at the bottom of the wall of the resist when the developer does not remove all of the resist from a desired opening. Consequently, the opening gets smaller (small cross-section) as the depth in the resist increases. FIG. 1 illustrates a patterned semiconductor device 100 on a substrate 102 exhibiting footing. The opening through the resist has a foot 108 at the interface between the resist layer 106 and the antireflective coating layer 104.

Figure 2:
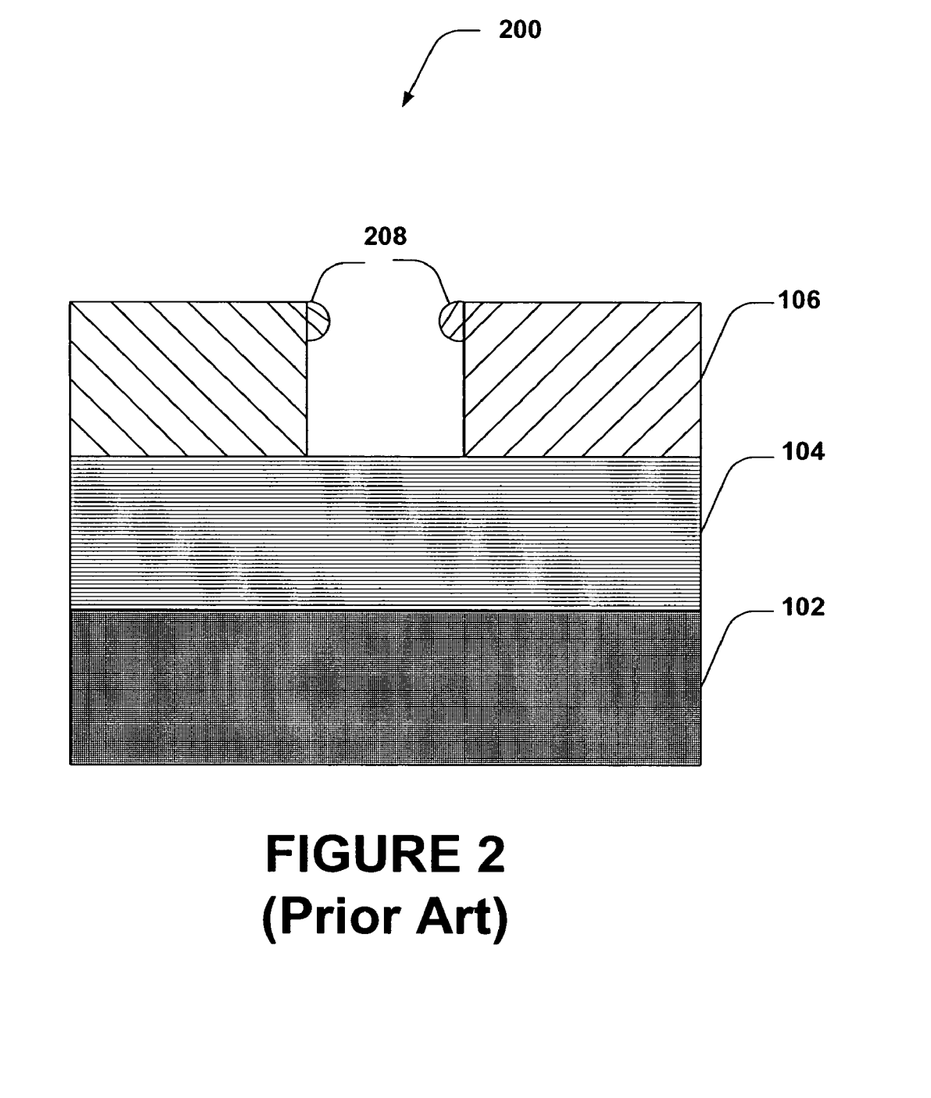
FIG. 2 depicts a cross-sectional illustration of a patterned semiconductor device exhibiting T-tops.

During post-exposure bake, the catalytic action of an acid generated by irradiation is susceptible to an undesirable reaction with basic compounds. Especially in the case of positive photoresist, if a basic gas such as ammonia gas or amine gas is present in the atmosphere between an exposure apparatus and a post-exposure bake apparatus, an acid generated by irradiation reacts with this basic gas and is neutralized. In addition, photo generated acid near the surface layer is susceptible to evaporation. Neutralization and/or evaporation of acids alter the pattern formation in the resist resulting in the formation of T-tops (a T-shaped overhang in the upper portion of the resist). FIG. 2 illustrates a patterned semiconductor device 200 exhibiting T-tops formation. The opening through the resist has a T-tops 208 at the upper portion of the resist. The T-tops 208 cause the opening near the surface of the resist 106 to be narrower at the top portion of the resist.

Despite many attempts to understand and prevent footing and for T-tops in resist processing, there remains a need for more effective and efficient methods of eliminating these defects.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention provides for an improved lithography process by disclosing methods for eliminating and/or mitigating defects in a resist pattern. More specifically, the present invention prevents and/or mitigates the formation of footing and T-tops in a resist through the use of a surface treatment with an acidic composition. Thus, the present invention advantageously enhances the quality and cost-effectiveness of semiconductor fabrication by facilitating an accurate transfer of a desired pattern.

According to one aspect of the present invention, a method is provided which prevents and/or mitigates the formation of defects in a resist. A resist layer is deposited on a surface of a semiconductor substrate, such as an antireflective coating (ARC) layer, and irradiated. The surface of the semiconductor substrate under the resist, such as the ARC layer, may be contacted with an acidic composition before the resist is deposited. The irradiated resist layer may be contacted with an acidic composition. The acid treated irradiated resist layer is subjected to post-exposure bake, developed, and processed. The developed resist layer is employed as a mask for underlying layer(s). Elimination and/or mitigation of footing and/or T-tops within the resist layer via contact with an acidic composition substantially facilitates the desired transfer of features of the resist layer to the underlayer.

According to another aspect of the present invention, a method is provided for reducing the formation of T-tops in a resist during a lithography process. The method involves forming a resist over a surface of a semiconductor substrate, irradiating the resist, contacting the resist with an acidic composition, heating the resist, and developing the resist.

According to yet another aspect of the present invention, a method is provided which reduces the formation of footing in a resist during a lithography process. The method involves contacting a surface of a semiconductor substrate with an acidic composition, and patterning a resist over the surface of the semiconductor substrate that is contacted with an acidic composition.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of

DISCLOSURE OF INVENTION

The present invention involves improving the pattern of a resist by eliminating and/or mitigating undesirable defects in the resist. The present invention more specifically involves treatment of a surface of a semiconductor substrate under a resist, such as an ARC layer, and/or a resist layer of a substrate with an acidic composition to effectively prevent and/or mitigate undesired species from inactivating photogenerated acids in certain regions of the resist. Therefore, the pattern accurately reflects the desired pattern and critical dimensions in the resulting fabricated structure are maintained.

Footing may be caused by a chemical interaction occurring at the interface between irradiated regions of the resist layer and an underlying layer. For example, when resists employ an acid amplification mechanism, the irradiated regions contain catalytic amounts of acid which provides a solubility differential between the irradiated and the unirradiated regions of the resist during subsequent development. The free amine groups and other molecular bases present on the surface of the semiconductor substrate can interact at the interface with the acid, and thereby neutralize some of the acid. As a result, subsequent development of the resist fails to remove or clear the amine poisoned areas at the interface between the resist layer and the underlying layer resulting in footing.

T-tops may be caused by a chemical interaction occurring between the basic compounds present in the local environment around the resist and the acid localized in the upper portions of the irradiated resist layer. This interaction may result in the inactivation/neutralization of the acid. As a result, subsequent development of the resist fails to remove or clear areas of the resist at the top portion of the opening resulting in T-tops formation. T-tops may also be caused by evaporation of the acid localized in the upper portions of the irradiated resist layer.

Although not wishing to be bound by any theory, it is believed that treatment of either a surface of a semiconductor substrate under a resist, such as an ARC layer, or a resist layer with an acidic composition facilitates neutralization of basic contaminants such as amines, ammonia or other nitrogen containing compounds responsible for the loss/inactivity of photogenerated acids, thereby preventing and/or mitigating formation of defects in a resist. For instance, the acidic composition can react with basic compounds accumulated on an ARC layer or diffused out of an ARC layer. In a similar fashion, the acidic composition can prevent the quenching of photo generated acid formed after exposure of the resist by basic compounds present in the local environment.

The present invention will now be described with reference to the drawings and flow diagrams, wherein like references numerals are used to refer to like elements throughout. It be understood that the description of these embodiments are merely illustrative and they should not be taken in a limiting sense.

As used herein, the term "substrate" refers to silicon structures, including silicon wafers, silicon structures in the process of fabrication, any layer on a silicon layer which is in the process of fabrication, a semiconductor layer, including a semiconductor, a semiconductor layer in the process of fabrication, and the like. In the present application, the terms "substrate" and "semiconductor substrate" are used interchangeably. The term "antireflective coating (ARC)" refers to any coating formed on a substrate using an antireflective material, such as silicon nitride, silicon oxynitride or functionally equivalent films, and the like. The term "acidic composition" refers to solutions comprising a liquid and an acid, acidic films, and the like. The liquid may be an inorganic solvent or an organic solvent. Examples of liquids include water, alcohols, and other polar solvents. The acid may be a weak acid, a dilute acid, a salt of an acid, an organic acid, an acidic polymer, a photo generated acid, alone or in combination with other compounds and mixtures.

Figure 3:
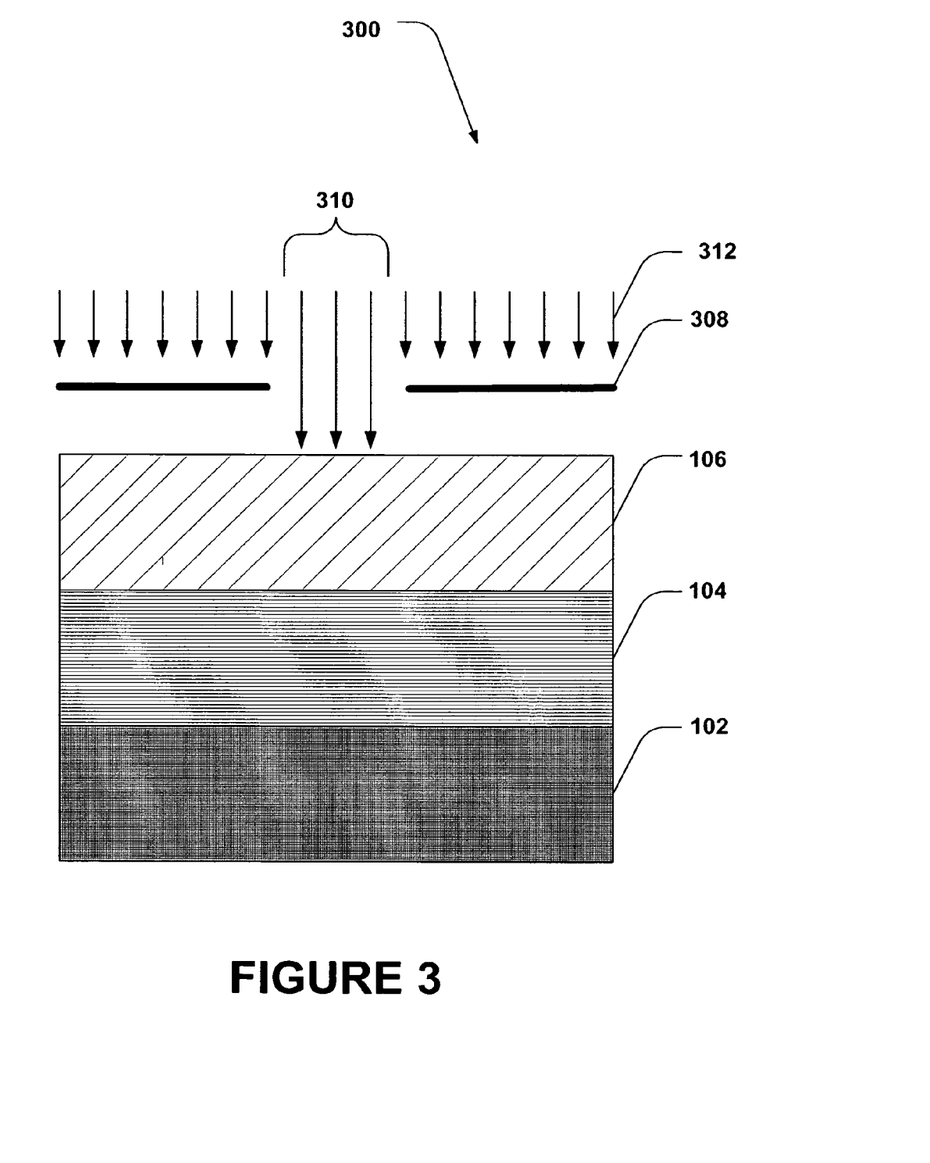
FIG. 3 depicts a cross-sectional illustration of a semiconductor device prior to irradiation of resist layer.

FIG. 3 depicts a cross-sectional illustration of a semiconductor device 300 of a semiconductor substrate 102 overlaid with an antireflective coating 104, which is in turn overlaid with a resist 106. The semiconductor substrate 102 can be any substrate used in the course of semiconductor processing or any semiconductor surface. Typically, the semiconductor substrate is a silicon substrate, optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc.

The ARC layer 104 can be any ARC applied to the semiconductor substrate surface by any suitable means. Examples of techniques for the application of the ARC include spin-on techniques, chemical vapor deposition (CVD) and plasma-enhanced chemical vapor deposition (PECVD). The ARC 104 can also be formed by delivering an antireflective material to a surface of the semiconductor device using a low soluble gas. Antireflective materials can be organic materials or inorganic materials such as silicon oxynitride (SiON) films. Both bottom ARC (BARC) and top ARC (TARC) materials can be used. Generally, the antireflective material has a refractive index, solubility and development properties substantially similar to the photoresist material. The ARC layer 104 is formed to a thickness suitable to provide antireflective properties. In one embodiment, the thickness of the ARC is from about 100 Å to about 1000 Å. In another embodiment, the thickness of the ARC layer 104 is from about 200 Å to about 500 Å.

Optionally, to enhance adhesion, prior to forming an antireflective coating, the substrate may be subjected to priming. Priming can be performed in any suitable manner. For example, priming may be achieved by at least one of dehydration baking prior to coating, contact with adhesion promoters such as hexa-methyl-di-silazane (HMDS) and Trimethylsilyldiethylamine (TMSDEA) or post-bake cycles.

The resist layer 106 is provided over at least a portion of the substrate 102, but typically over the entire substrate. Generally, a chemically amplified photoresist is used. Any carbon containing resist may be applied to the substrate surface by any suitable means. For example, a 157 nm photoresist, a 193 nm photoresist, a 13 nm photoresist, an 11 nm photoresist, an I-line, H-line, G-line, E-line, deep UV, extreme UV, X-ray resist, electron beam resist or chemically amplified photoresist material may be spin-coated on the substrate surface. The resist layer 106 is formed by applying resist to the substrate 102 and spinning the substrate to achieve a uniform thickness of the resist layer 106. The centrifugal forces of the spinning substrate 102 serve to evenly distribute the resist over the substrate 102.

Positive or negative resists may be used. Resists are commercially available from a number of sources, including Shipley Company, DuPont, Arch Chemical, Aquamer, Hunt, Hoechst Celanese Corporation, Clariant, JSR Microelectronics, and Brewer. The resist is typically applied to a thickness from about 1,000 Å to about 30,000 Å, although the thickness of the resist is not critical to the invention.

A mask or reticle 308 is positioned over the substrate 102 with the ARC layer 104 and the resist layer 106. Selected areas 310 of the resist layer 106 are exposed to actinic radiation or electron beams 312 to cause a chemical transformation in desired regions of the resist. The wavelength of irradiation is not critical to the invention. In one embodiment, the wavelength of irradiation is about 250 nm or less. The selectively irradiated resist is developed using a suitable developer, such as an aqueous developer. The specific identity of the developer is not critical to the invention, but typically an aqueous alkaline solution is employed. For example, aqueous tetramethylammonium hydroxide may be employed as a developer solution.

During development, either the irradiated portion of the resist (in embodiments where a positive resist is employed) or the unirradiated portion of the resist (in embodiments where a negative resist is employed) is soluble or is solubilized in the developing solution. The portion of the resist 106 that is not substantially soluble in the developing solution remains on the substrate 102. Development results in a patterned resist (the remaining portion of the resist) over the substrate 102 surface. Various semiconductor processing acts such as etching, metal deposition, and ion implantation may be performed.

Figure 4:
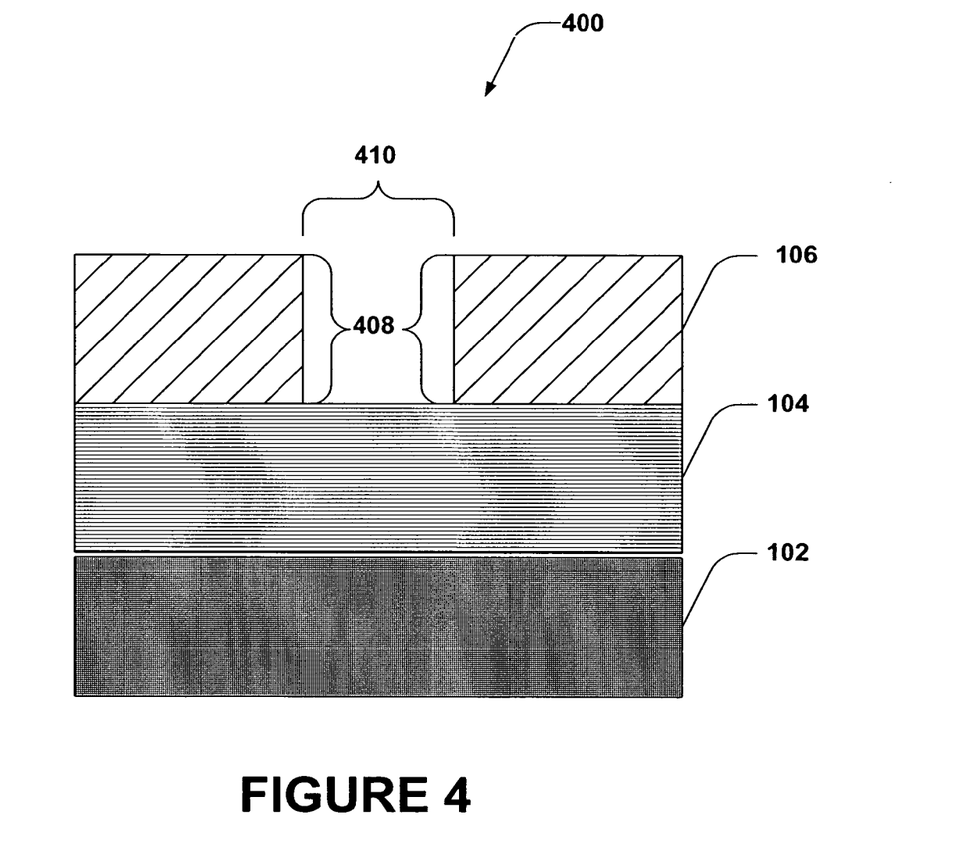
FIG. 4 depicts a cross-sectional illustration of a properly patterned semiconductor device in accordance with one aspect of the present invention showing no defects in the resist opening.

FIG. 4 depicts a cross-sectional illustration of a properly patterned semiconductor device 400 produced in accordance with one aspect of the present invention showing no defects. The semiconductor device 400 comprises the semiconductor substrate 102, the ARC 104, and the resist layer 106. The resist layer 106 of the device 400 is patterned as described with reference to FIG. 3, resulting in an opening 410. The opening 410 through the resist 106 has clear vertical lines 408 and uniform thickness throughout, indicating no defects in the resist 106.

Figure 5:
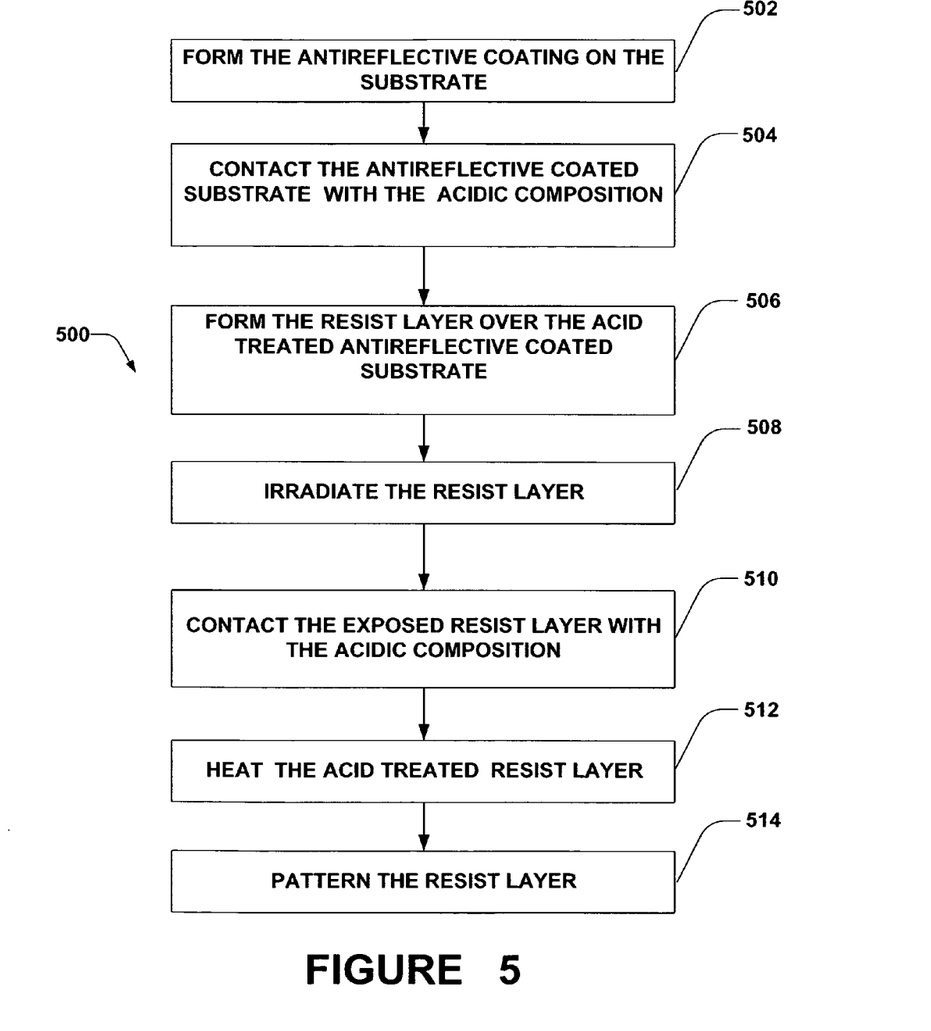
FIG. 5 provides a flow chart showing certain actions of a method in accordance with one aspect of the present invention carried out to prevent and/or mitigate footing and/or T-tops.

FIG. 5 provides a method 500 in accordance with one aspect of the present invention. Method 500 can be employed in producing the device 400 of FIG. 4. Act 502 is contacting a surface of a semiconductor substrate with an acidic composition. In one embodiment of the present invention the surface of the semiconductor substrate contained an antireflective coating. The antireflective coating is formed as described earlier during the discussion of ARC layer 104.

In general, the acidic composition contains a liquid and any dilute acid, weak acid, a salt of a weak acid, acidic substances, or mixtures thereof. The liquid is typically water, although polar organic solvents may also be employed alternatively. In one embodiment of the present invention, an acidic composition does not contain a peroxide compound such as hydrogen peroxide because it is believed that some of the materials and processes employed in lithography are sensitive to the presence of peroxides such as hydrogen peroxide. The acidic composition may optionally contain various additives such as coating forming additives, surfactants, mobility enhancers, etc. In one embodiment, dilute aqueous sulfuric acid is used with surfactants to increase the adhesion and enhance uniformity. Any commercially available surfactant may be used. In yet another embodiment, the acidic composition is any commercially available acidic top anti reflective coating material. Non-limiting examples of acidic top antireflective materials include AZ®-Aquatar (available from Clariant Corp., USA), JSR NFC 540 (JSR Corp., Japan) or JSR NFC 620 (JSR Corp., Japan).

The acid may be organic or inorganic. Examples of acids include $HC_2H_3O_2$, $H_2CO_3$, $H_3PO_4$, HF, HCl, HBr, sulfurous acid, sulfuric acid, perchloric acid, boric acid, or fluoroalkylsulfonic acid. For instance, dilute aqueous sulfuric acid may be used as the acidic composition. The amount of sulfuric acid in the dilute aqueous sulfuric acid can be from about 0.1% to about 50% by volume of the sulfuric acid.

Further examples of acids include carboxylic acids and polycarboxylic acids such as alkanoic acids, including formic acid, acetic acid, propionic acid, butyric acid and so on, dichloroacetic acid, trichloroacetic acid, perfluoroacetic acid, perfluorooctanoic acid, (generally containing 1 to about 10 carbon atoms), dicarboxylic acids, such as oxalic acid, malonic acid, succinic acid and so on (generally containing 1 to about 12 carbon atoms), hydroxyalkanoic acids, such as citric acid (generally containing 1 to about 10 carbon atoms), organic phosphorus acids such as dimethylphosphoric acid and dimethyl-phosphinic acid, sulfonic acids such as alkylsulfonic acids (containing 1 to about 20 carbon atoms) including methanesulfonic acid, ethanesulfonic acid, 1-pentanesulfonic acid, 1-hexanesulfonic acid, 1-heptanesulfonic acid, aromatic sulfonic acids such as benzenesulfonic acid, benzenedisulfonic acid, tolulenesulfonic acid, naphthalenesulfonic acid, etc. Moreover, in some embodiments, two or more of any of the above-described acids may be used.

The contact of the acidic composition can be by any suitable means. In one embodiment, the acidic composition is applied by spraying the acidic composition on to the surface of the semiconductor substrate. The acidic composition is sprayed over the surface of the semiconductor substrate in a manner that it covers or at least substantially covers the area of the surface of the semiconductor substrate. In another embodiment, the acidic composition is contacted by immersing the surface of the semiconductor substrate into an acidic composition. In yet another embodiment, the acidic composition is applied as a coating. The acid containing coating is deposited over the surface of the semiconductor substrate in a manner that it covers or at least substantially covers the area of the surface of the semiconductor substrate.

The acidic composition contains a suitable amount of acid to mitigate footing and/or T-tops. In one embodiment, the acidic composition contains from about 0.01 to about 50% by volume of at least one acid. In another embodiment, the acidic composition contains from about 0.1 to about 25% by volume of at least one acid.

The acidic composition can be of any suitable pH to mitigate footing and/or T-tops. Typically, the pH of the acidic composition is less than 7. In one embodiment, the pH of the acidic composition is from about 2 to about 6.5. In another embodiment the pH of the acidic composition is from about 2 to about 6.

The acidic composition is contacted with the surface of the semiconductor substrate as soon as possible. For example, the surface of the semiconductor substrate with the ARC layer is contacted with the acidic composition about one hour after the ARC layer is formed. In one embodiment, the ARC layer is contacted with the acidic composition within about 10 minutes after the ARC layer is formed. However, time may elapse after the ARC formation and before the resist is formed. In one embodiment, the acidic composition on the surface of the semiconductor substrate is allowed to evaporate before forming the resist layer.

The acidic composition is contacted with the surface of the semiconductor substrate for an amount of time sufficient to react with and neutralize basic compounds on the surface of the semiconductor substrate. Typically, the time which the acidic composition is contacted with the surface of the semiconductor substrate is from about 1 second to about 1 hour. In one embodiment, the time which the acidic composition is contacted with the surface of the semiconductor substrate is typically from about 5 seconds to about 10 minutes. In another embodiment, the time which the acidic composition is contacted with the surface of the semiconductor substrate is typically from about 10 seconds to about 2 minutes. Optionally, the surface of the semiconductor substrate is monitored to determine the levels of basic compounds such as amines, ammonia, n-methylpyrrolidone, and tetramethylammonium hydroxide on the surface of the semiconductor substrate. Any suitable monitoring system can be used. For example, a spectroscopy based method can be used to monitor the level of basic compounds on the surface of the semiconductor substrate.

The temperature during the contact between the acidic composition and the surface of the semiconductor substrate is typically from about 10° C. to about 500° C. Optionally, the acid treated surface of the semiconductor substrate is washed prior to forming the resist layer.

Act 504 is forming a resist layer over the treated the surface of the semiconductor substrate. Act 506 is irradiating a portion of the resist layer. Act 508 is contacting the resist layer formed from act 506 with an acidic composition. The acidic composition is described above. The acidic composition can be the same or different to that which contacts the surface of the semiconductor substrate.

The contacting of the acidic composition with the resist layer can be by any suitable means. In one embodiment, the acidic composition is applied by spraying on the resist layer. The acidic composition is sprayed over the resist layer in a manner that it covers or at least substantially covers the surface of the irradiated resist layer. In another embodiment the acidic composition is contacted by immersing the substrate with the irradiated resist layer into an acidic composition. In yet another embodiment, the acidic composition is applied as a coating. The acid containing coating is deposited over the irradiated resist layer in a manner that it covers or at least substantially covers the surface of the irradiated resist layer.

The acidic composition contains a suitable amount of acid to mitigate footing and/or T-tops. In one embodiment, the acidic composition contains from about 0.01 to about 50% by volume of at least one acid. In another embodiment, the acidic composition contains from about 0.1 to 25% by volume of at least one acid.

The acidic composition can be of any suitable pH to mitigate footing and/or T-tops. Typically, the pH of the acidic composition is less than 7. In one embodiment, the pH of the acidic composition is from about 2 to about 6.5. In another embodiment the pH of the acidic composition is from about 2 to about 6.

The resist layer is contacted with the acidic composition as soon as possible after the irradiation. For example, the resist layer is contacted with the acidic composition about 10 minutes after the resist layer is irradiated. In another embodiment, the resist layer is contacted with the acidic composition within about 5 minutes or less after the resist layer is irradiated.

The acidic composition is contacted with the resist layer for an amount of time sufficient to react with molecular bases on the irradiated resist layer. Typically, the time which the acidic composition is contacted with the resist layer is from about 1 second to about 1 hour. In one embodiment, the time which the acidic composition is contacted with the resist layer is typically from about 5 seconds to 10 about minutes. In another embodiment, the time which the acidic composition is contacted with the irradiated resist layer is typically from about 10 seconds to about 2 minutes. Optionally, the resist layer is monitored to determine the levels of basic compounds on the resist layer. Any suitable monitoring system can be used. For example, a spectroscopy based method can be used to monitor the level of basic compounds on the resist layer. The temperature during the contact between the acidic composition and the irradiated resist layer is typically from about 70° C. to about 110° C.

Act 510 is heating the resist layer. Heating of the acid treated resist layer can be done in any suitable manner. For example, heating of the acid treated resist layer may be performed in a convection oven or on a hot plate. The temperature for the heating can be any suitable temperature. In one embodiment, the acid treated resist layer is heated to a temperature from about 75° C. to about 150° C. In another embodiment, the acid treated irradiated resist layer is heated to a temperature from about 80° to about 120° C. Act 512 is developing and processing the substrate of act 510 to obtain desired patterns.

Figure 6:
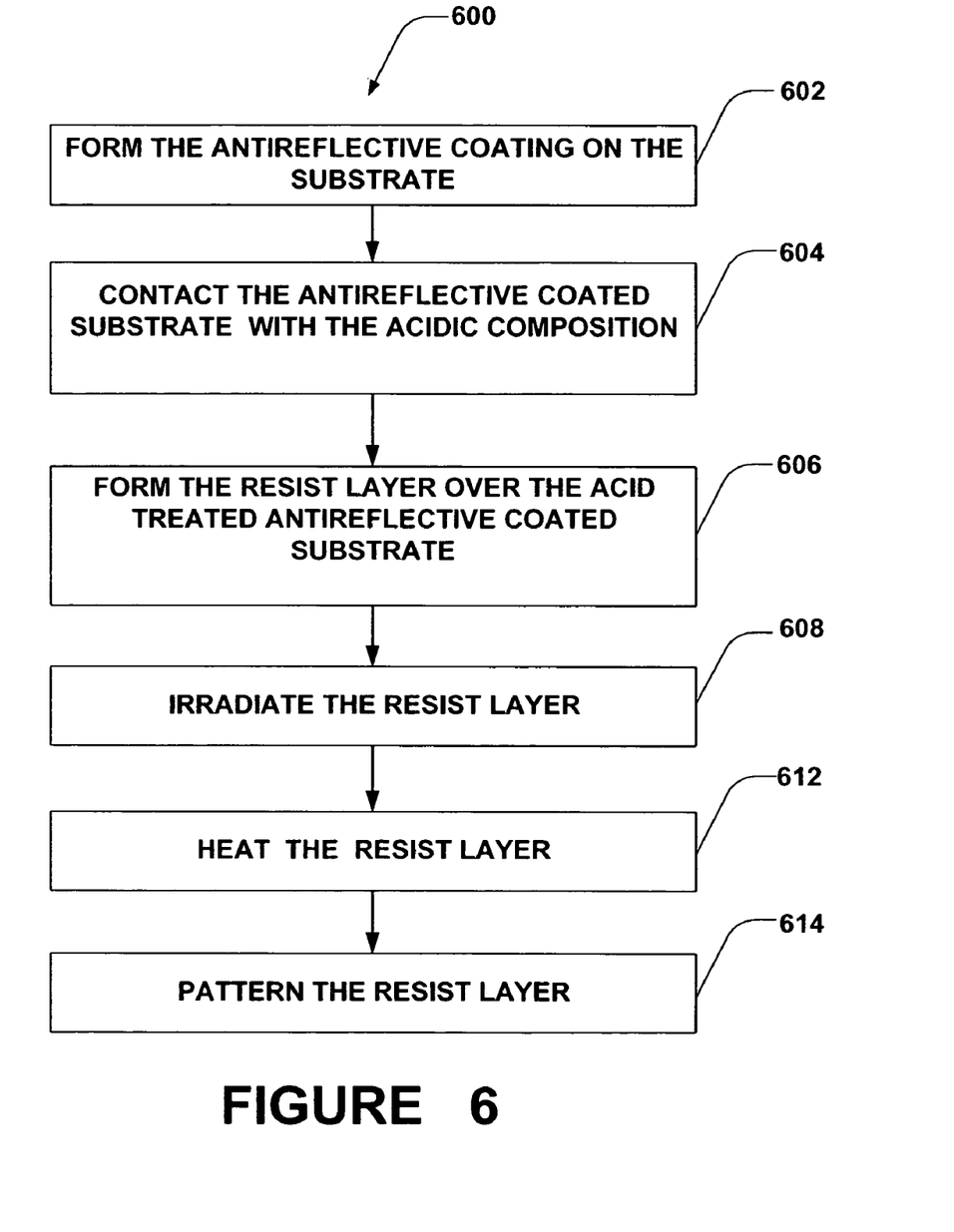
FIG. 6 provides a flow chart showing certain actions of a method in accordance with one aspect of the present invention carried out to prevent and/or mitigate footing.

FIG. 6 provides a flow chart showing certain actions in a method 600 in accordance with one aspect of the present invention carried out to mitigate footing.

Act 602 is contacting an acidic composition with a surface of a semiconductor substrate. In one embodiment of the present invention, act 602 is contacting the acidic composition with an antireflective-coated surface of the semiconductor substrate. In another embodiment of the present invention, act 602 is contacting the acidic composition with the substrate having a dielectric, a metal, or a polysilicon layer instead of an antireflective material. In other words, the acidic composition contacts any underlying surface over which a resist is subsequently formed. Act 602 is similar to corresponding act 502 of method 500. In one embodiment of the present invention, act 604 is forming a resist layer over the treated substrate. In another embodiment of the present invention, act 604 is forming a resist layer over the treated ARC layer. Optionally, prior to irradiation, the resist layer is contacted with one or more layers of antireflective material. Any suitable antireflective material can be used. For example, any commercially available TARC such as AZ-Aquatar or JSR NFC may be used. Act 606 is exposing the resist layer to irradiation. Act 610 is heating the resist layer. Act 612 is developing and processing the substrate to obtain desired patterns. Acts 604, 606, 610 and 612 are similar to corresponding acts 504, 506, 510, and 512 of method 500. Optionally, the irradiated resist is contacted with an acidic composition similar to corresponding act 508 of method 500.

Figure 7:
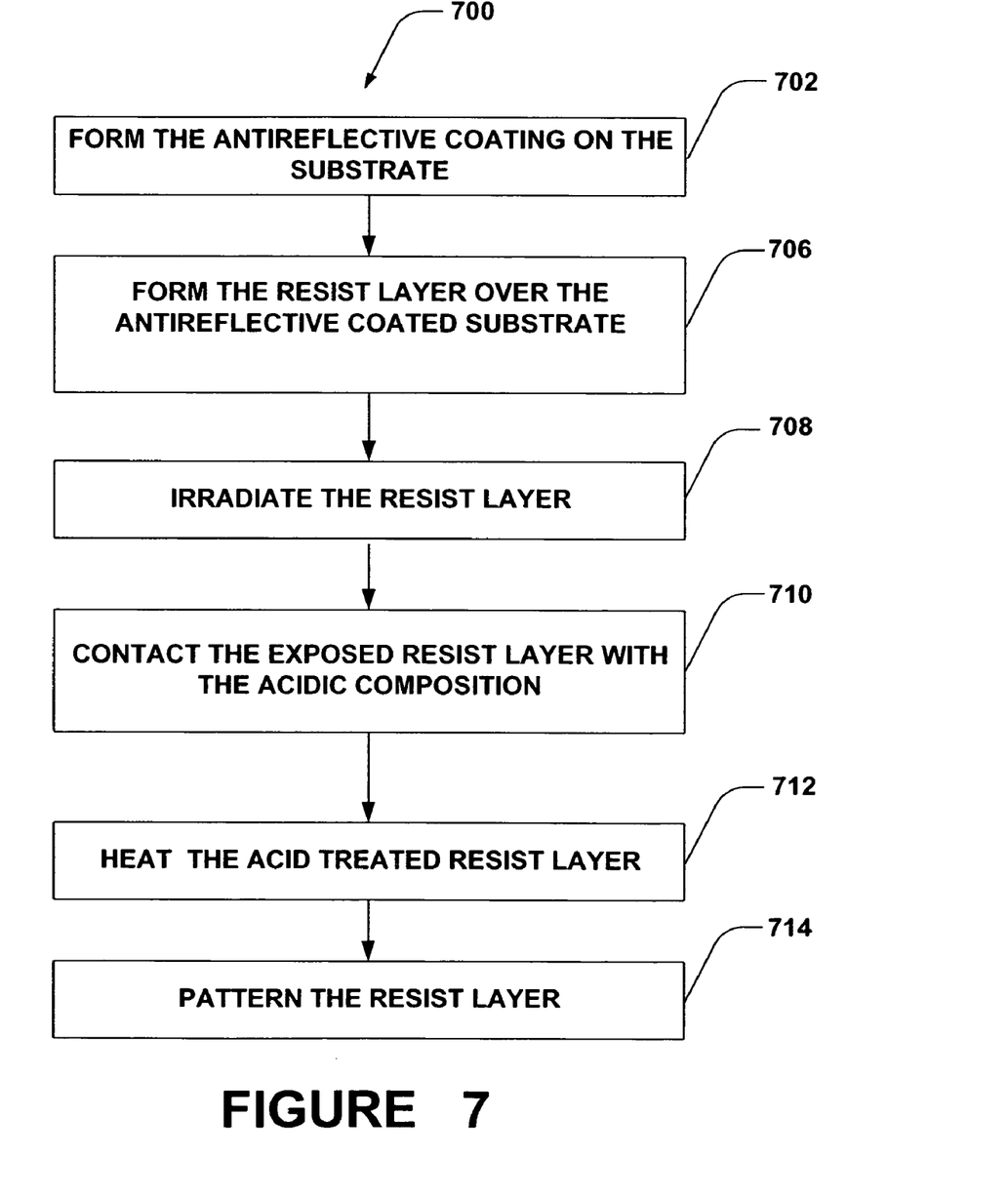
FIG. 7 provides a flow chart showing certain actions of a method in accordance with one aspect of the present invention carried out to prevent and/or mitigate T-tops formation.

FIG. 7 provides a flow chart showing certain actions in a method 700 in accordance with one aspect of the present invention carried out to mitigate T-tops formation. Method 700 can be employed in producing the device 400 of FIG. 4.

Act 704 is forming a resist layer over the surface of a semiconductor substrate. Act 706 is exposing the resist layer to irradiation. Act 708 is contacting the resist layer of act 706 with an acidic composition. Act 708 is similar to corresponding act 508 of method 500. Optionally, the method 700 may include formation of an antireflective coating followed by a contact with an acid composition, prior to forming of the resist layer.

Act 710 is heating the resist layer. Heating of the acid treated resist layer can be done in any suitable manner. For example, the heating of the acid treated resist layer may be carried out in oven or on a hot plate. The temperature for the heating can be any suitable temperature. In one embodiment, the acid treated resist layer is heated to a temperature from about 75° C. to 150° C. In another embodiment, the acid treated resist layer is heated to a temperature from about 80° C. to 120° C. Act 712 is developing and processing the substrate of act 710 to obtain desired patterns.

The methods of the present invention significantly prevent and/or mitigate the defects in a resist and thereby improve pattern shape and reproducibility. It is appreciated that other aspects of the invention may vary the formations of the described layers. Additionally, multiple ARC and resist layers may be formed over a semiconductor device.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for reducing formation of T-tops in a resist during a lithography process, comprising:
    forming an antireflective coating over a semiconductor substrate;
    forming a resist over a surface of the antireflective coated semiconductor substrate, wherein the resist is one selected from a positive resist and a negative resist;
    irradiating the resist;
    contacting the surface of the irradiated resist on the antireflective coated semiconductor substrate with an acidic composition with the proviso that the acidic composition does not comprise a peroxide compound, wherein the acidic composition neutralizes basic compounds;
    heating the resist; and
    developing the resist, wherein if the resist is a positive resist, developing the resist comprises removing irradiated portions of the resist, and wherein if the resist is a negative resist, developing the resist comprises removing unirradiated portions of the resist.

2. The method of claim 1, wherein the acidic composition comprises at least one selected from the group consisting of a dilute acid, weak acid, salt of a weak acid, acidic substances, and combinations thereof.

3. The method of claim 1, wherein the acidic composition comprises at least one selected from the group consisting of $HC_2H_3O_2$, $H_2CO_3$, $H_3PO_4$, HF, HCl, HBr, sulfurous acid, sulfuric acid, perchloric acid, boric acid, and fluoroalkylsulfonic acid.

4. The method of claim 1, wherein the acidic composition comprises dilute aqueous sulfuric acid.

5. The method of claim 1, further comprising monitoring basic compounds on the surface of the antireflective coated semiconductor substrate using a system for monitoring basic compounds on the surface of the irradiated resist.

* * * * *